United States Patent

Ludikhuize

[19]

[11] Patent Number: 5,910,670
[45] Date of Patent: Jun. 8, 1999

[54] SEMICONDUCTOR DEVICE WITH IMPROVED BREAKDOWN VOLTAGE CHARACTERISTICS

[75] Inventor: Adrianus W. Ludikhuize, Eindhoven, Netherlands

[73] Assignee: U.S. Philips Corporation, New York, N.Y.

[21] Appl. No.: 08/995,467

[22] Filed: Dec. 22, 1997

[30] Foreign Application Priority Data

Dec. 23, 1996 [EP] European Pat. Off. ............ 962036901

[51] Int. Cl.⁶ .............................. H01L 29/10; H01L 29/76
[52] U.S. Cl. ........................... 257/343; 257/335; 257/339
[58] Field of Search .................................. 257/339, 335, 257/343, 341, 337, 345

[56] References Cited

U.S. PATENT DOCUMENTS

| | | | |
|---|---|---|---|
| 5,144,389 | 9/1992 | Nakamura et al. | 257/339 |
| 5,258,636 | 11/1993 | Ramenik et al. | 257/339 |
| 5,523,599 | 6/1996 | Fujishima et al. | 257/327 |
| 5,534,721 | 7/1996 | Shibib | 257/339 |
| 5,633,521 | 5/1997 | Koishikawa | 257/336 |
| 5,635,743 | 6/1997 | Takahashi | 257/343 |
| 5,719,421 | 2/1998 | Hatter et al. | 257/335 |
| 5,841,166 | 11/1998 | D'anna et al. | 257/335 |

*Primary Examiner*—Donald L. Monin, Jr.
*Attorney, Agent, or Firm*—Steven R. Biren

[57] ABSTRACT

It is possible for electrical breakdown to occur at a lower voltage in the case of a strong current in a lateral DMOST having a conventional interdigitated source/drain configuration as compared with lower current values. The invention is based on the recognition that this breakdown arises at the end faces of the drain fingers owing to current convergence at the ends of the fingers and the Kirk effect associated therewith. To increase the SOAR (safe operating area) of the transistor, the tips 11 of the drain fingers 7 are rendered inactive in that the source fingers 6 are locally interrupted. In an optimized embodiment, the source fingers are shorter than the drain fingers at the ends of these drain fingers.

5 Claims, 2 Drawing Sheets

SEMICONDUCTOR DEVICE WITH IMPROVED BREAKDOWN VOLTAGE CHARACTERISTICS

BACKGROUND OF THE INVENTION

The invention relates to a semiconductor device with a semiconductor body comprising a layer-shaped region of a first conductivity type which adjoins a surface and which merges into a subjacent semiconductor region, called substrate hereinafter, of the opposite, second conductivity type via a pn junction, which semiconductor body is provided with a high-voltage transistor of the lateral DMOS type, comprising a source zone of the first conductivity type adjoining the surface, a base region of the second conductivity type surrounding the source zone in the semiconductor body and also adjoining the surface, and a drain zone of the first conductivity type which adjoins the surface and which is situated at a distance from the base region and is separated therefrom by an interposed portion of the layer-shaped region, the source and drain zones of the transistor forming an interdigitated configuration with at least three elongate zones of the first conductivity type lying next to one another, of which the central zone forms a drain zone with at least an end face and of which the two outermost zones situated on either side of the central zone each form a source zone.

Such a device is known from inter alia U.S. Pat. No. 5,523,599. An n-channel DMOST is described therein formed in an n-well at the surface of a p-type substrate. The transistor has an interdigitated source/drain configuration so as to obtain a high current-carrying capacity. As is shown inter alia in FIG. 7 of U.S. Pat. No. 5,523,599, the high-ohmic n-well, which at the same time forms the drift region of the transistor, is interrupted at the area of the tips of the drain fingers and forms a pn junction with the p-type substrate, which is also high-ohmic, at the area of the tips of the drain fingers. A higher breakdown voltage is obtained thereby, given a high voltage applied to the drain, than if the n-well were not interrupted. In the latter case, indeed, the n-well would form a pn junction with the p-type base region at the area of the fingertips with a lower breakdown voltage owing to the higher doping level of the base region. A disadvantage of this embodiment is that the p-type base region is connected to the p-type substrate in an electrically conductive manner, whereas it is desirable for a number of applications that different voltages should be applied to the substrate and the base region. In addition, the n-type surface region is not formed by an n-well which is locally provided in many processes, but by an epitaxial layer which extends over the entire surface area, which renders it difficult to form a drift region with the configuration described above.

SUMMARY OF THE INVENTION

The invention has for its object inter alia to provide a lateral DMOST with a breakdown voltage which is sufficiently high for many applications, while the disadvantages explained above are at least partly eliminated.

According to the invention, a semiconductor device of the kind described in the opening paragraph is for this purpose characterized in that the base region is situated with its entire surface area in the layer-shaped region of the first conductivity type and is separated from the substrate by said layer-shaped region, and in that the outermost zones of the first conductivity type extend substantially parallel to the longitudinal direction of the central zone along the central zone and are interrupted at said end face of the central zone.

The absence of the source at the area of the tips (i.e. end faces) of the drain fingers prevents or at least substantially prevents a current from flowing from the source to the drain fingers. This is found to lead to an increase in the breakdown voltage at high currents, and thus to an expansion of the safe operating area or SOAR. This improvement is also obtained when the drift region is not interrupted at the tips of the drain fingers and forms a continuous layer around the transistor. The invention is based inter alia on the recognition that the breakdown voltage in a lateral DMOST is reduced by the moving electric charge (Kirk effect). A strong increase in the current density will occur at the area of the tips of the drain fingers as a result of current convergence in a configuration where the source extends around the tips of the drain fingers. An increase in the electric field strength will occur there more readily owing to the Kirk effect than in places with a uniform current distribution. The result of this is that breakdown can occur at a lower voltage in the case of high currents than in the case of low currents. This reduction of the breakdown voltage is avoided in a device according to the invention in that the tips are rendered inactive.

In a first embodiment, the layer-shaped region of the first conductivity type may be formed by a well which is provided through implantation or diffusion at the surface of a substrate of the opposed conductivity type and which extends at least over the entire region of the transistor to be formed. A further embodiment of a semiconductor device according to the invention is characterized in that the layer-shaped region of the first conductivity type is formed by a layer which was provided epitaxially on the substrate.

In a further embodiment, the base region is also interrupted at the non-active end faces of the drain fingers. An embodiment which has among its advantages that the manufacturing process is simpler is characterized in that the base region comprises a portion which is situated opposite the end face of the drain and which lies free from the source zone of the first conductivity type.

A further embodiment of a device according to the invention in which an increase in the current density at the end faces of the drain fingers can be optimally prevented is characterized in that, seen at the surface, the drain zone extends farther into the semiconductor body at said end face than do the source zones situated on either side thereof.

An embodiment of a device according to the invention in which field concentration is reduced in a simple manner, and thus also the connected risk of breakdown at the tips of the drain fingers, is characterized in that the drain zone is provided with a drain contact which is connected to the drain zone through a window in an electrically insulating layer on the surface and which, seen at the surface, extends as a field plate over the insulating layer to beyond the drain zone at the end face of this drain zone.

BRIEF DESCRIPTION OF THE DRAWING

These and other aspects of the invention will be explained in more detail with reference to an embodiment. In the drawing.

DESCRIPTION OF THE PREFERRED EMBODIMENTS

Figure 1:
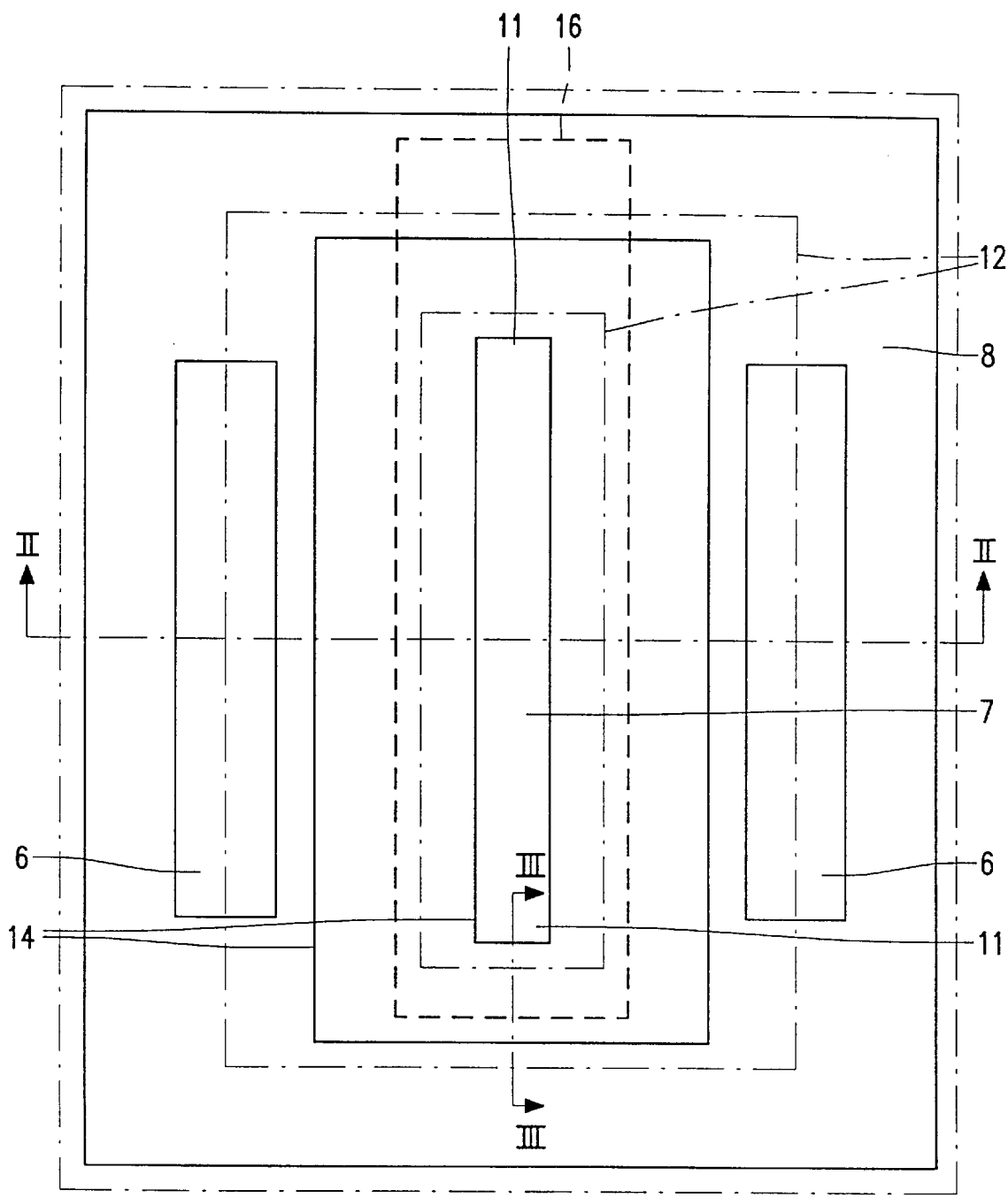
FIG. 1 is a diagrammatic plan view of a semiconductor device according

It is noted that the drawing is diagrammatic and not true to scale.

Furthermore, only a single transistor is shown in the Figure. It will be obvious, however, that besides this transistor other circuit elements may be provided in the semiconductor body.

The device shown in FIGS. 1 and 2 comprises a semiconductor body 1 of silicon with a layer-shaped region 2 of a first conductivity type which adjoins the surface and which merges into an adjoining region 4 of the second, opposed conductivity type, called substrate hereinafter, via a pn junction 3. In the present embodiment, which relates to a transistor with an n-type channel, the surface region 2 is of the n-type and the substrate 4 of the p-type, but it will be obvious that the invention is not limited thereto and is equally applicable to transistors having a p-type channel, in which case the above conductivity types are to be reversed. The semiconductor body is provided at its surface with a high-voltage transistor of the lateral DMOST type, for example for use in a range from 100 V to 1000 V. The transistor, which is of the n-channel type as stated above, comprises an n-type source zone 6 adjoining the surface and an n-type drain zone 7 also adjoining the surface. The source zone 6 is separated from the n-type surface region 2 by a p-type base region 8, often called backgate region, in which the channel region 9 is defined. The drain region 7 and the base region 8 are separated from one another by an interposed portion 10 of the layer-shaped surface region 2 which forms a drift region of the transistor.

Figure 2:
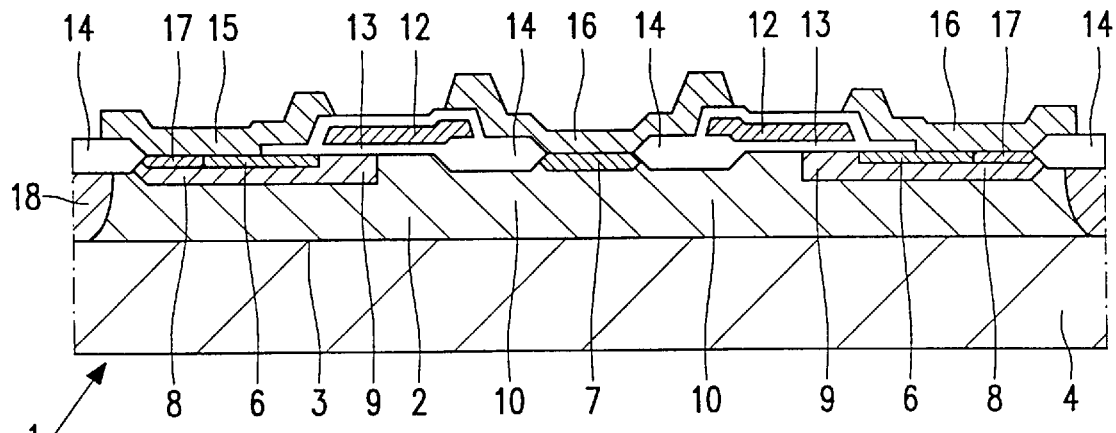
FIG. 2 is a cross-section through this device taken on the line II—II.

As is evident from FIG. 1, the source and drain zones 6, 7 are provided in an interdigitated configuration so as to obtain the desired current-conducting capacity. In the example shown here, the drain is provided with only a single elongate finger-shaped zone or digit 7 with two end faces. It will be obvious that the drain may alternatively comprise two or more such digits in practical embodiments, which digits may be interconnected at one side, each having one end face in that case. The source zone 6 is provided on either side of the drain zone 7.

In contrast to the known transistor described further above, the p-type base region 8 is situated with its entire surface area in the n-type layer-shaped surface region 2 and is separated by this region from the p-type substrate 4. This renders it possible inter alia to provide the surface region 2 as an epitaxial layer on the p-type substrate through deposition. It is also possible, if so desired, to insulate the p-type regions 4 and 8 from one another electrically, so that different potentials can be applied to these regions. To obtain a sufficiently high breakdown voltage, according to the invention, the outermost n-type zones 6 forming the source of the transistor extend exclusively parallel to the longitudinal direction of the central n-type zone 7, i.e. the drain of the transistor, and are interrupted at the end faces 11 of the zone 7. The source is accordingly absent at these ends of the drain, so that no current passage takes place in these locations.

The transistor further comprises a gate electrode 12 of, for example, polycrystalline silicon which is separated from the semiconductor body by gate oxide 13. The gate oxide has a transition into thicker field oxide 14 above the drift region 10, the latter oxide also bounding the transistor along its outer circumference. The source and drain zones are connected to source and drain electrodes 15 and 16, respectively, the source electrode also being connected to the base region 8 via the strongly doped p-type zone 17. The drain electrode 16 is shown in broken lines in FIG. 1. The gate electrode 12 is indicated with a dash-dot line in FIG. 1. The portion of the epitaxial layer in which the transistor is formed may be electrically insulated from other portions of the device by means of an island insulation 18. The device may be further manufactured by means of techniques which are known per se.

Figure 4:
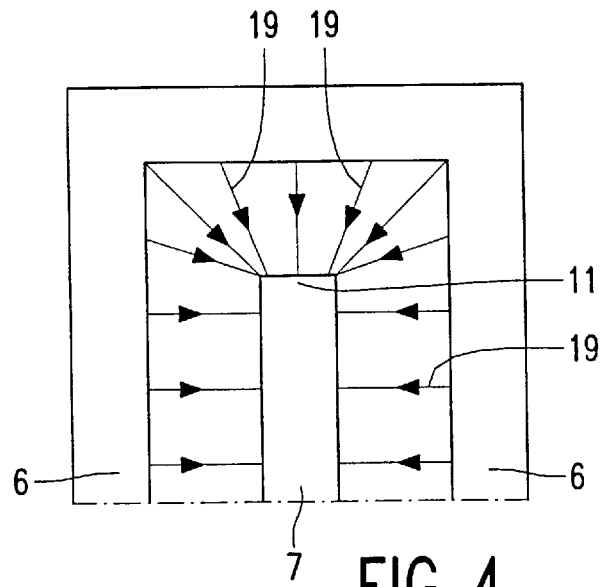
FIG. 4 is a plan view of a conventional DMOST design.

To clarify the effect of the measure according to the invention, FIG. 4 diagrammatically shows a plan view of a DMOST with a continuous source zone 6 around the end face 11 of the drain 7. Other parts of the transistor, such as the gate and base region, are not indicated for greater clarity. The arrows 19 indicate the electric current between source and drain. As is apparent from the drawing, current convergence occurs at the end face 11 of the drain zone 7. This means that an increase in the electric field strength will occur more readily at the end face 11 of the drain 7 owing to the Kirk effect than in other locations. The result of this is that the device will be more prone to breakdown, which is usually accompanied by destruction of the device, at strong currents than at weak currents. This effect may arise in particular during switching of capacitive loads because the current and voltage can reach a maximum simultaneously in that case. When the transistor is rendered inactive at the end face of the drain through a local interruption of the drain zone, this disadvantage is counteracted in a simple manner, and the current-voltage area in which the transistor can be safely operated (SOAR=safe operating area) can be considerably increased, which is an advantage.

Major advantages are obtained in embodiments in which the source fingers are as long as the drain fingers. To prevent current convergence at the tips of the drain fingers as much as possible, however, the source fingers 6 are made shorter than the drain finger 7, as shown in FIG. 1, so that substantially no current passage to the tips 11 of the drain finger takes place.

In the embodiment shown here, the base region 8 is formed by a zone which extends uninterruptedly on either side of the drain zone 7 and around the end face 11 of the drain zone. In an alternative embodiment, the base region may obviously also be interrupted at the end face 11 of the drain zone. In an analogous manner, the gate electrode 12 may also be interrupted at the area of the end face 11 of the drain.

Figure 3:
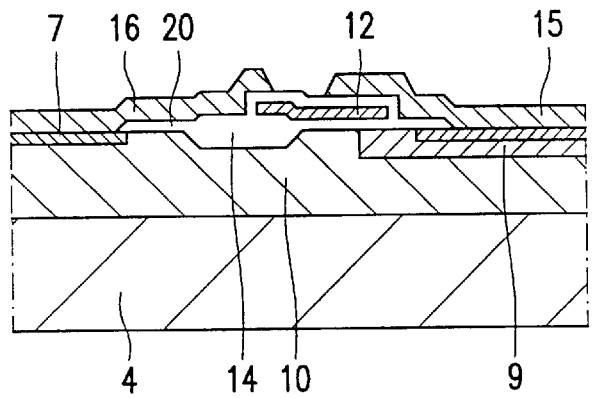
FIG. 3 is a cross-section through this device taken on the line III—III in a slightly modified embodiment.

As is shown in the plan view of FIG. 1, the drain electrode 16 extends over the drift region 10 at the area of the end face 11 of the drain. As a result, the electrode 16 acts as a field plate on the drain at high voltages, so that the electric field in the drift region is reduced, and thus the breakdown voltage is raised. To enhance this effect, the field oxide 14 at the end face 11 of the drain may be provided at some distance away from the drain zone 7, in a modified version of the device shown in FIG. 1. This is shown in FIG. 3, which is a cross-section through this modified version taken on the line III—III in FIG. 1. A surface portion of the drift region 10 is situated between the drain zone 7 and the field oxide 14 and is covered by a thinner oxide 20 where the electrode 16 effectively acts as a field plate, thus reducing the concentration of equipotential lines.

It will be obvious that the invention is not limited to the examples given here, but that many more variations are possible to those skilled in the art within the scope of the invention. Thus the conductivity types of the examples described here may be reversed. The drain may be given a more rounded end face so as to obtain a favorable field distribution. The invention may be advantageously applied to embodiments in which the drain zone comprises two or more fingers instead of a single finger, all flanked on either side by fingers of the source zone.

What is claimed is:

1. A semiconductor device with a semiconductor body comprising a layer-shaped region of a first conductivity type which adjoins a surface and which merges into a subjacent semiconductor region, called substrate hereinafter, of the opposite, second conductivity type via a pn junction, which semiconductor body is provided with a high-voltage transistor of the lateral DMOS type, comprising a source zone of the first conductivity type adjoining the surface, a base region of the second conductivity type surrounding the source zone in the semiconductor body and also adjoining the surface, and a drain zone of the first conductivity type which adjoins the surface and which is situated at a distance from the base region and is separated therefrom by an interposed portion of the layer-shaped region, the source and drain zones of the transistor forming an interdigitated configuration with at least three elongate zones of the first conductivity type lying next to one another, of which the central zone forms a drain zone with at least an end face and of which the two outermost zones situated on either side of the central zone each form a source zone, characterized in that the base region is situated with its entire surface area in the layer-shaped region of the first conductivity type and is separated from the substrate by said layer-shaped region, and in that the outermost zones of the first conductivity type extend substantially parallel to the longitudinal direction of the central zone along the central zone and are interrupted at said end face of the central zone.

2. A semiconductor device as claimed in claim 1, characterized in that the layer-shaped region of the first conductivity type is formed by a layer which was provided epitaxially on the substrate.

3. A semiconductor device as claimed in claim 1, characterized in that the base region comprises a portion which is situated opposite the end face of the drain and which lies free from the source zone of the first conductivity type.

4. A semiconductor device as claimed in claim 1, characterized in that, seen at the surface, the drain zone extends farther into the semiconductor body at said end face than do the source zones situated on either side thereof.

5. A semiconductor device as claimed in claim 1, characterized in that the drain zone is provided with a drain contact which is connected to the drain zone through a window in an electrically insulating layer on the surface and which, seen at the surface, extends as a field plate over the insulating layer to beyond the drain zone at the end face of this drain zone.

* * * * *